(12) United States Patent
Fukuyoshi et al.

(10) Patent No.: US 8,004,028 B2
(45) Date of Patent: Aug. 23, 2011

(54) SOLID STATE IMAGING DEVICE, MANUFACTURING METHOD OF THE SAME, AND SUBSTRATE FOR SOLID STATE IMAGING DEVICE

(75) Inventors: Kenzo Fukuyoshi, Tokyo (JP); Tadashi Ishimatsu, Tokyo (JP); Keisuke Ogata, Tokyo (JP); Mitsuhiro Nakao, Tokyo (JP); Akiko Uchibori, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 43 days.

(21) Appl. No.: 12/385,969

(22) Filed: Apr. 24, 2009

(65) Prior Publication Data
US 2009/0206435 A1 Aug. 20, 2009

Related U.S. Application Data

(60) Division of application No. 11/599,373, filed on Nov. 15, 2006, which is a continuation of application No. PCT/JP2005/011485, filed on Jun. 16, 2005, now Pat. No. 7,737,044.

(30) Foreign Application Priority Data

Jun. 23, 2004 (JP) ................................ 2004-185566
Jan. 27, 2005 (JP) ................................ 2005-019848

(51) Int. Cl.
*H01L 31/062* (2006.01)
*H01L 31/113* (2006.01)

(52) U.S. Cl. . 257/294; 257/432; 257/440; 257/E33.073; 257/E33.06

(58) Field of Classification Search ............ 257/98, 257/432, 440, E31.127, 294, 443, E33.06, 257/E33.073; 348/294, 302, 308, 309, 335, 340

See application file for complete search history.

(56) References Cited

U.S. PATENT DOCUMENTS

| | | | |
|---|---|---|---|
| 5,371,397 A | 12/1994 | Maegawa et al. | |
| 5,605,783 A | 2/1997 | Revelli et al. | |
| 5,796,154 A * | 8/1998 | Sano et al. | 257/432 |
| 6,640,057 B1 * | 10/2003 | Szajewski et al. | 396/322 |
| 2001/0009442 A1 | 7/2001 | Fukuyoshi et al. | |
| 2002/0058350 A1 | 5/2002 | Kim | |
| 2003/0071271 A1 | 4/2003 | Suzuki et al. | |
| 2003/0215967 A1 * | 11/2003 | Shizukuishi | 438/22 |

(Continued)

FOREIGN PATENT DOCUMENTS

EP 0 573 219 12/1993

(Continued)

OTHER PUBLICATIONS

Notice of Allowance in Parent U.S. Appl. No. 11/599,373 dated Feb. 1, 2010.

(Continued)

*Primary Examiner* — Matthew Smith
*Assistant Examiner* — Quovaunda V Jefferson

(57) ABSTRACT

A solid state imaging device including photoelectric conversion devices which are arranged two-dimensionally; a color filter including a plurality of picture elements, each disposed corresponding to each of the photoelectric conversion devices; and a plurality of transfer lenses each disposed corresponding to each of the picture elements, formed of a thermoset acrylic resin, and formed directly on each of the picture elements, wherein a gap between neighboring transfer lenses is not more than 0.035 μm, and a contact length between neighboring transfer lenses is within the range of 3-80% of the pitch of the plurality of transfer lenses.

8 Claims, 8 Drawing Sheets

U.S. PATENT DOCUMENTS

| | | |
|---|---|---|
| 2004/0185588 A1 | 9/2004 | Fukuyoshi et al. |
| 2005/0061950 A1* | 3/2005 | Jiang et al. ................ 250/208.1 |
| 2009/0206435 A1 | 8/2009 | Fukuyoshi et al. |

FOREIGN PATENT DOCUMENTS

| | | |
|---|---|---|
| EP | 1 414 071 | 4/2004 |
| EP | 1 414 073 | 4/2004 |
| JP | 60-53073 | 3/1985 |
| JP | 6-37058 | 2/1994 |
| JP | 6-112459 | 4/1994 |
| JP | 2000-269474 | 9/2000 |
| JP | 2001-208902 | 8/2001 |
| JP | 2003-229550 | 8/2003 |
| JP | 2003-315506 | 11/2003 |
| JP | 2004-035821 * | 2/2004 |
| JP | 2004-94119 | 3/2004 |
| JP | 2004-228398 | 8/2004 |
| KR | 2002-0034311 * | 5/2002 |

OTHER PUBLICATIONS

International Search Report of International Application No. PCT/JP2005/011485, Date of Mailing of the International Search Report: Nov. 28, 2005. (5pp).

International Preliminary Report on Patentability, mailed Jan. 11, 2007, and issued in corresponding International Patent Application No. PCT/JP2005/011485.

U.S. Appl. No. 11/599,373, filed Nov. 15, 2006, Kenzo Fukuyoshi et al., Toppan Printing Co., Ltd.

Office Action mailed Jul. 2, 2009 for co-pending U.S. Appl. No. 11/599,373.

Korean Patent Office Action dated Apr. 29, 2011 in Appln. No. 10-2006-7027045.

Japanese Office Action dated Jun. 7, 2011 in Appln. No. 2005-019848.

* cited by examiner

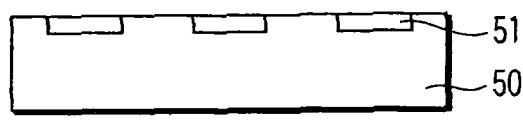
F I G. 10A
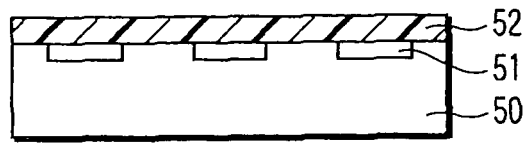
F I G. 10B
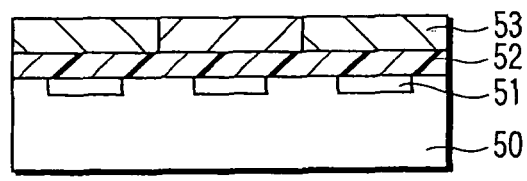
F I G. 10C
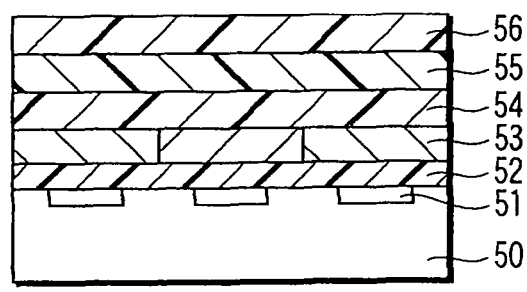
F I G. 10D
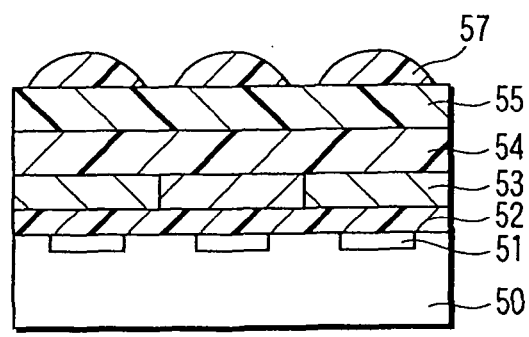
F I G. 10E
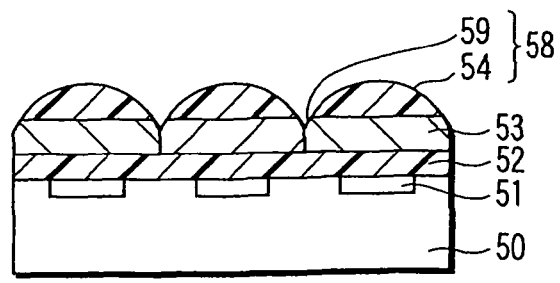
F I G. 10F

SOLID STATE IMAGING DEVICE, MANUFACTURING METHOD OF THE SAME, AND SUBSTRATE FOR SOLID STATE IMAGING DEVICE

CROSS-REFERENCE TO RELATED APPLICATIONS

This application is a divisional of and claims the benefit of priority to U.S. application Ser. No. 11/599,373, filed Nov. 15, 2006, now U.S. Pat. No 7,737,044, which is a U.S. continuation application of PCT Application No. PCT/JP2005/011485, filed Jun. 16, 2005, which was published under PCT Article 21(2) in English, the entire contents of which are incorporated herein by reference. This application is also based upon and claims the benefit of priority from prior Japanese Patent Applications No. 2004-185566, filed Jun. 23, 2004; and No. 2005-019848, filed Jan. 27, 2005, the entire contents of both of which are incorporated herein by reference.

BACKGROUND OF THE INVENTION

1. Field of the Invention

The present invention relates to a solid state imaging device represented by a photoelectric conversion device such as a C-MOS, CCD, etc., to a method of manufacturing the solid state imaging device, and to a substrate for a solid state imaging device. In particular, the present invention relates to a solid state imaging device provided with a micro lens which is substantially free from surface roughness and small in inter-lens gap, to a method of manufacturing such a solid state imaging device, and to a substrate for the solid state imaging device.

2. Description of the Related Art

A region (aperture) of photoelectric conversion device such as a C-MOS, CCD, etc., which is designed to contribute to the photoelectric conversion is limited to about 20 to 40% based on the entire area of the photoelectric conversion device, though it depends on the size of elements as well as on the number of picture elements. Since limited size of aperture directly leads to the deterioration of photosensitivity thereof, there has been generally practiced, in order to complement the limited size of aperture, to provide the photoelectric conversion device with a micro lens for converging light.

Recently however, there has been an increasing demand for a very fine CCD imaging device where the number of picture elements exceeds over three million. In this very fine CCD imaging device, the decrease of aperture ratio of the micro lens (i.e., decrease of photosensitivity) mounted thereon as well as the deterioration in quality of image due to the increase of noise such as flare and smear are now becoming great issues to be dealt with. As far as the imaging device such as a C-MOS, CCD, etc., is concerned, the number of picture elements is now approaching to almost a sufficient degree so that attentions among the competitive device makers are now being shifted gradually from the number of picture elements to the quality of image. In order to enable the imaging device to mount on a portable telephone or small PDA equipments, the size of picture element of the imaging device is now being gradually miniaturized as small as around 2 um.

As for the technique of forming the micro lens, Japanese Laid-open Patent Publication (Kokai) No. 60-53073 (1985), for example, describes relatively in detail about the technique of employing dry etching. In this Japanese Laid-open Patent Publication, there are also disclosed about the technique of forming the lens into a semi-spherical configuration by taking advantage of thermal fluidity of resin by using heating flow of resin as well as about the technique of forming an organic film such as a film of PGMA or an inorganic film such as a film of OCD ($SiO_2$ type) on the surface of the lens.

Japanese Laid-open Patent Publication (Kokai) No. 6-37058 (1994), for example, describes in detail about the technique of forming a micro lens through transfer and working by dry etching and about the technique of using $CF_4$ gas and $0_2$ gas as an etching gas in the dry etching. Hereinafter, for the purpose of convenience, a micro lens to be prepared by dry etching technique will be referred to as transfer lens and this working method of lens will be referred to as a transfer method.

Due to the facts that it is possible, through the employment of the transfer lens, to make thinner a stack structure comprising a color filter and a planarization layer to be formed on a photoelectric conversion device and also to increase the aperture ratio of micro lens higher than that of heating flow lens, it can be said that the characteristics of the transfer lens resides in the capability thereof to enhance the performance of imaging device.

Further, there is described, in Japanese Laid-open Patent Publication (Kokai) No. 6-112459 (1994) and Japanese Laid-open Patent Publication (Kokai) No. 2003-229550 (2003) for example, techniques of forming transfer lens wherein a heating flow lens is formed on a layer of photosensitive lens material by using the same photosensitive lens material and the resultant heating flow lens is employed as a master to transfer the pattern of the master by dry etching, thereby forming the transfer lenses. Further, the technique of minimizing the gap between picture elements by using a photosensitive lens material is described in Japanese Laid-open Patent Publication (Kokai) No. 2000-269474 (2000) for example.

The method of forming a micro lens through the transfer of the configuration of lens master by dry etching is generally performed by a method wherein a lens master is created at first on an underlying transparent resin layer by using a photosensitive resinous material exhibiting heating flow property of resin and by sequentially subjecting the photosensitive resinous material to exposure, development and heating flow of resin, and then the pattern of lens master is transferred onto the underlying transparent resin layer by dry etching to form the transfer lenses.

In the creation of the micro lens according to this transfer method, the height of the transfer lens to be created depends on the etching rate of the underlying transparent resin layer as well as on the etching rate of the lens master.

Theoretically, it may be possible to control the configuration of lens through the combination of the transparent resin layer for forming the transfer lens with the etching rate of the lens master.

For example, if it is desired to make the configuration of lens lower than the lens master, it is conceivable to employ either a method of selecting a lens master which is larger in etching rate or a method of selecting a transparent resin which is smaller in etching rate. However, since the resin to be employed as a lens master is required to be excellent in heating flow property of resin as well as in photosensitivity so as to enable it to form a pattern through exposure and development, the range of option is relatively narrow so that if the resin is selected based solely on the etching rate thereof, other characteristics thereof may be sacrificed. On the other hand, if a transparent resin which is smaller in etching rate such as styrene resin or phenol resin is selected, since these materials are low in heat resistance, i.e., at most 230° C. or so in heat resistance, and furthermore, since these materials are low in etching rate, the employment of these materials would lead to deterioration of productivity efficiency.

Whereas, a photosensitive resin excellent in heating flow property of resin is generally smaller in etching rate than the materials for forming the transfer lens (underlying transparent layer) which is desirable for use in terms of transparency and heat resistance. Therefore, when the lens master created from a photosensitive resin is transferred to a transparent resin layer, the resultant transfer lens thus obtained would become larger in height than the lens master and also become larger in gap (i.e. greater in inter-lens gap).

In this case, since the lens is rounded by taking advantage of the surface tension to be created by the heating flow of photosensitive resin, it is difficult to control the height of the lens master itself, so that it is impossible to make the lens master extremely high or low.

As for specific examples of the photoelectric conversion device to be essentially employed in order to enable a solid imaging device to function, CCD and C-MOS are known for example. While the CCD is advantageous in that it can be made into a fine structure, the C-MOS is advantageous in that the structure thereof is relatively simple and small in power consumption, so that they are properly employed depending on specific purposes. As for the distance from the surface of a semiconductor substrate to the photoelectric conversion device, it is relatively short in the case of the CCD but relatively long in the case of the C-MOS. Therefore, it is required, in accordance with their specific characteristics, to specifically select the focal distance of micro lens, i.e., the height of micro lens. However, as described above, in the case of transfer system, the height of the transfer lens to be obtained is determined based on the etching rate of the underlying transparent resin layer and on the etching rate of the lens master, thereby raising the problem that the configuration of lens cannot be controlled.

Further, in order to enhance the sensitivity and image quality, the aperture ratio of solid state imaging device is generally required to be as close to 100% as possible. Therefore, in order to achieve this aperture ratio, the distance between neighboring micro lens (hereinafter, referred to as an inter-lens gap) should preferably be as small as possible, or ideally the neighboring micro lens should be contacted with each other. However, there is a problem that, in the case of the micro lens to be formed by means of heating flow of resin, it is impossible to make the inter-lens gap extremely small because of the requirement to retain the configuration of lens.

Further, the solid state imaging device is required to exhibit a heat resistance of as high as 200° C. or more in the manufacturing process thereof. Recently in particular, there is an increasing demand that a semiconductor device comprising an imaging device is capable of being mounted using a lead-free solder and hence the semiconductor device is now required to exhibit a heat resistance ranging from 240 to 260° C.

Under the circumstances mentioned above, it is conceivable to employ acrylic resin which is a thermosetting resin as a resin excellent in heat resistance. The acrylic resin however is accompanied with the problem that the etching rate thereof is generally higher than that of the heating flow type photosensitive resin to be employed as a material for forming the lens master and hence the height of transfer lens to be created may become too high. Further, a resin which is excellent in heat resistance such as thermally cured acrylic resin is generally somewhat insufficient in dry etching resistance and the surface thereof is liable to become roughened, so that, if such a resin is employed, the surface of transfer lens would be greatly roughened, thereby causing the scattering of light and hence resulting in the deterioration of light transmittance and also in the deterioration in quality of image.

Furthermore, in conformity with the trend to miniaturize the solid state imaging device, it is also required to reduce the reflectance factor of incident light at the surface of micro lens, thereby reducing the re-incidence of the reflected light from the cover glass of the surface of solid state imaging device to enhance the quality of image (improvement of signal-to-noise ratio). As for the materials for forming such a micro lens, it is possible to preferably employ a resin of low refractive index such as fluorine-based acrylic resin, etc. However, a resin which is low in refractive index is more likely to generate a roughened surface due to the dry etching thereof. Therefore, when a transparent resin layer is formed by using the resin of low refractive index and a pattern of the lens master is transferred to the transparent resin layer, the surface of transfer lens to be obtained would be roughened much more, thus raising a problem.

SUMMARY OF THE INVENTION

A first object of the present invention is to provide a method of manufacturing a solid state imaging device, which makes it possible to control the height of lens.

A second object of the present invention is to provide a solid state imaging device which is provided with transfer lenses which are small in inter-lens gap, and to provide a method of manufacturing such transfer lenses.

A third object of the present invention is to provide a solid state imaging device which is provided with transfer lens which is capable of suppressing the surface roughness, and to provide a method of manufacturing such transfer lens.

According to a first aspect of the present invention, there is provided a method of manufacturing a solid state imaging devices comprising photoelectric conversion devices which are arranged two-dimensionally; color filters each disposed corresponding to each of the photoelectric conversion devices; and a plurality of transfer lenses each disposed directly or indirectly on the color filter; the method including: 1) forming a plurality of color filters differing in color from each other; 2) forming a transparent resin layer on the color filters; 3) forming an etching control layer on the transparent resin layer, the etching control layer being enabled to be etched at a different etching rate from the etching rate of the transparent resin layer; 4) forming a lens master on the etching control layer by using a heat-flowable resin material; 5) transferring a pattern of the lens master to the etching control layer by dry etching to form an intermediate micro lens; and 6) transferring a pattern of the intermediate micro lens to the transparent resin layer by dry etching to form the transfer lenses.

In the case of the method of manufacturing a solid state imaging device according to the first aspect of the present invention, since an etching control layer to be etched at a different etching rate from the etching rate of the transparent resin layer is formed on the transparent resin layer, it is possible to control the height of transfer lens irrespective of the transparent resin layer to be employed as a lens-forming material.

In this case, the etching control layer may be smaller in etching rate than the etching rate of the transparent resin layer. By doing so, the height of lens can be lowered. Further, it is possible to obtain transfer lenses which are small in inter-lens gap.

The transparent resin layer may include acrylic resin, in particular, acrylic resin having a benzene ring in the skeleton thereof. Alternatively, the transparent resin layer may be formed of a resin including an organic compound having a benzene ring.

By doing so, it is now possible to form a micro lens excellent in light transmittance and also to suppress the surface roughness. Further, since the etching rate can be lowered in this manner, the height of the transfer lens can be reduced. Additionally, the inter-lens gap can be further minimized.

Furthermore, the transparent resin layer may include fluorine-based acrylic resin.

Moreover, the transparent resin layer may be formed of a resin containing not less than 0.2% of a compound having a refractive index of 1.47 or less.

The etching control layer may be formed of a material having a function for control a heating flow of resin.

Particularly, the etching control layer may be formed of styrene resin or phenolic resin.

The transfer lens may be constituted by a transparent resin layer and a color filter. Since an upper portion of the color filter is also utilized to constitute a portion of the micro lens, the distance between the micro lens and the photoelectric conversion device can be reduced, thus making it possible to obtain a solid state imaging device which is small and excellent in photosensitivity.

According to a second aspect of the present invention, there is provided a solid state imaging device including photoelectric conversion devices which are arranged two-dimensionally; color filters each disposed corresponding to each of the photoelectric conversion devices; and a plurality of transfer lenses each disposed directly or indirectly on the color filter; the solid state imaging device being characterized in that the gap between neighboring transfer lenses among the plurality of transfer lenses is not more than 0.035 µm, and that the contact length between neighboring transfer lenses disposed at a gap of not more than 0.035 µm is confined within the range of 3-80% of the pitch of the plurality of transfer lenses.

In the solid state imaging device according to the second aspect of the present invention which is constructed as described above, since the gap between neighboring transfer lenses is confined to not more than 0.035 µm, and since the contact length between neighboring transfer lenses disposed at a gap of not more than 0.035 µm is confined within the range of 3-80% of the pitch of a plurality of the transfer lenses, it is possible to achieve a high aperture ratio and an excellent light uptake efficiency.

In this case, the surface roughness of the transfer lens can be restricted to 50 nm or less.

Further, the transfer lens may be formed of a resin containing not less than 0.2% of a compound having a refractive index of 1.47 or less. By doing so, the surface roughness of transfer lens as well as the surface reflection of incident light can be suppressed.

As for the compound having a refractive index of 1.47 or less, it is possible to employ a fluorine compound or a silicon compound.

The peripheral portion of the transfer lens can be constituted by a color filter. Since an upper portion of the color filter is also utilized to constitute a portion of the micro lens, the distance between the micro lens and the photoelectric conversion device can be reduced, thus making it possible to obtain a solid state imaging device which is small and excellent in photosensitivity.

According to a third aspect of the present invention, there is provided a substrate for a solid state imaging device, which includes photoelectric conversion devices which are arranged two-dimensionally; color filters each disposed corresponding to each of the photoelectric conversion devices; a transparent resin layer formed directly or indirectly on the color filter; an etching control layer which can be etched at a different etching rate from the etching rate of the transparent resin layer; and a heat-flowable resin layer formed on the etching control layer.

According to the first aspect of the present invention, since an etching control layer which can be etched at a different etching rate from that of the transparent resin layer is interposed between the transparent resin layer to be employed as the transfer lens and the heat-flowable resin material to be employed as the lens master, it is possible to optionally control the height of the transfer lens to be ultimately formed. Therefore, it is possible to provide a solid state imaging device which is provided with micro lens having any desired focal distance.

Further, in one embodiment of the first aspect of the present invention, the etching rate of the etching control layer is made smaller than the etching rate of the transparent resin layer, thereby making it possible not only to lower the height of the intermediate micro lens to be obtained through the transfer of the pattern of lens master to the etching control layer but also to minimize the inter-lens gap. Then, this intermediate micro lens is transferred onto the transparent resin layer, thereby not only enabling the height of the transfer lens to be ultimately created to become close to the height of the lens master that has been initially formed but also making it possible to minimize the inter-lens gap. Therefore, it is now possible to obtain a solid state imaging device which is small in conversion discrepancy of height from the lens master, high in aperture ratio and excellent in light uptake efficiency.

Further, in another embodiment of the first aspect of the present invention, the transparent resin layer is formed using acrylic resin, in particular, acrylic resin having a benzene ring in the skeleton thereof or the transparent resin layer is formed using a resin comprising an organic compound having a benzene ring, thereby making it possible to form a micro lens which is excellent in light transmittance. In this case, the surface roughness of the lens can be also suppressed. Additionally, since the etching rate can be decreased, the height of the transfer lens to be formed can be reduced. Further, the inter-lens gap can be further minimized. Therefore, it is possible to obtain a solid state imaging device which is short in focal distance. Additionally, it is now possible to obtain a solid state imaging device which is high in aperture ratio, small in light scattering of the surface of lens and excellent in light uptake efficiency.

Further, in still another embodiment of the first aspect of the present invention, the transparent resin layer is formed using fluorine-based acrylic resin, thereby making it possible to decrease the refractive index of the transfer lens to be formed and to suppress the surface reflection on incident light, thus obtaining a solid state imaging device which is excellent in light uptake efficiency and small in generation of noise. Alternatively, the transparent resin layer is formed using a resin containing not less than 0.2% of a compound having a refractive index of not more than 1.47, thereby making it possible to obtain a solid state imaging device wherein the surface roughness of the transfer lens is further suppressed to minimize the scattering of light on the surface of lens while decreasing the refractive index of the transfer lens.

According to the second aspect of the present invention, since the gap between neighboring transfer lenses is confined to not more than 0.035 µm, and since the contact length between neighboring transfer lenses disposed at a gap of not more than 0.035 µm is confined within the range of 3-80% of the pitch of a plurality of the transfer lenses, it is possible to achieve a high aperture ratio and an excellent light uptake efficiency.

In this case, when the surface roughness of the transfer lens is confined to 50 nm or less, it is possible to provide a solid state imaging device which is capable of suppressing the deterioration of light transmittance and of the quality of image that may be caused to occur due to the scattering of light.

Further, according to the third aspect of the present invention, since the substrate having a predetermined stack structure is subjected to a prescribed working, it is possible to provide a solid state imaging device provided with transfer lenses wherein the height thereof can be optionally controlled.

BRIEF DESCRIPTION OF THE DRAWINGS

FIG. 10A is a cross-sectional view illustrating one step in the manufacturing method of a solid state imaging device according to Example 10;

FIG. 10B is a cross-sectional view illustrating one step in the manufacturing method of a solid state imaging device according to Example 10;

FIG. 10C is a cross-sectional view illustrating one step in the manufacturing method of a solid state imaging device according to Example 10;

FIG. 10D is a cross-sectional view illustrating one step in the manufacturing method of a solid state imaging device according to Example 10;

FIG. 10E is a cross-sectional view illustrating one step in the manufacturing method of a solid state imaging device according to Example 10;

FIG. 10F is a cross-sectional view showing the solid state imaging device manufactured according to Example 10.

DESCRIPTION OF EMBODIMENTS

Next, various embodiments of the present invention will be explained in detail.

Figure 1:
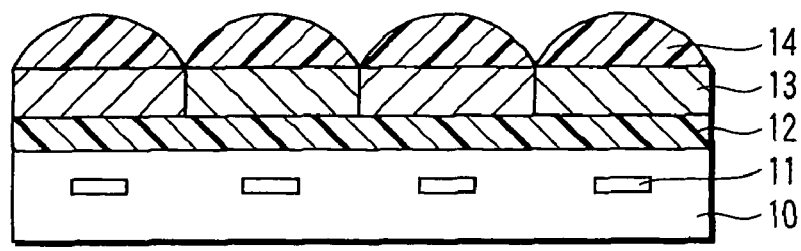
FIG. 1 is a partially sectioned view of a solid state imaging device which was obtained by the manufacturing method according to one embodiment of the present invention.

FIG. 1 is a partially sectioned view of a solid state imaging device which was obtained according to one embodiment of the present invention. FIGS. 2A-2G are partial cross-sectional views illustrating in stepwise the manufacturing method of the solid state imaging device shown in FIG. 1. FIG. 3 is a plane view of the solid state imaging device shown in FIG. 1.

As shown in FIG. 1, the solid state imaging device according to one embodiment of the present invention is constituted by photoelectric conversion devices 11 functioning to convert light into an electric signal which are arranged two-dimensionally in a semiconductor substrate 10; a planarization layer 12 for flattening a rugged surface which is formed on the semiconductor substrate 10; color filters 13 for color-separating incident light formed on the planarization layer 12; and a plurality of transfer lenses 14 each disposed directly or indirectly on the color filter.

Figure 2A:
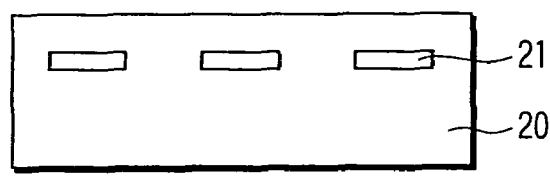
FIG. 2A is a cross-sectional view illustrating one step in the manufacturing method of a solid state imaging device according to one embodiment of the present invention.
Figure 2B:
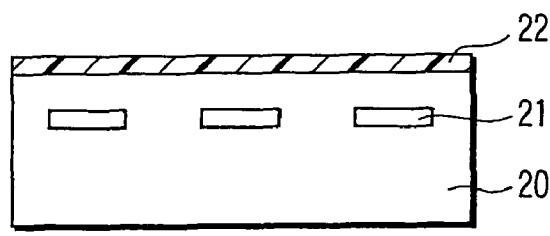
FIG. 2B is a cross-sectional view illustrating one step in the manufacturing method of a solid state imaging device according to one embodiment of the present invention.

This solid state imaging device can be manufactured by the method shown in FIGS. 2A-2G. First of all, a planarization layer 22 for flattening a rugged surface (FIG. 2B) is formed on a semiconductor substrate 20 having photoelectric conversion devices 21 two-dimensionally arranged therein (FIG. 2A).

Figure 2C:
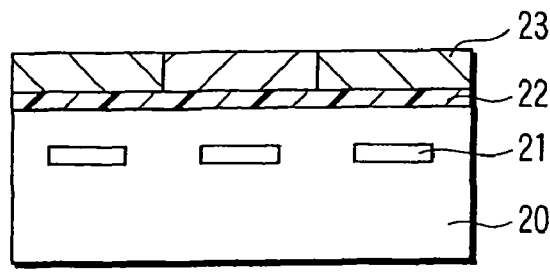
FIG. 2C is a cross-sectional view illustrating one step in the manufacturing method of a solid state imaging device according to one embodiment of the present invention.
Figure 3:
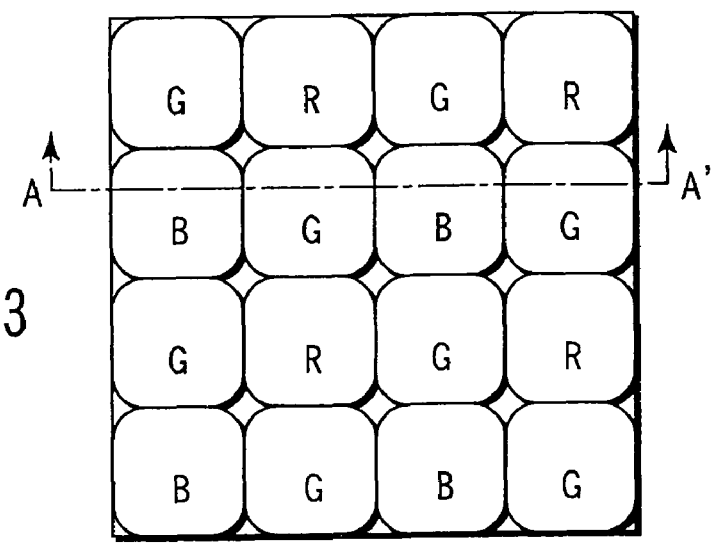
FIG. 3 is a plane view illustrating part of the solid state imaging device shown in FIG. 1.

Then, by using plural kinds of color resists (photosensitive coloring resin compositions), a color filter 23 is formed by repeating photolithography processes a plurality of times (FIG. 2C). FIG. 3 shows a plane view of the array of color filter 23. A G (green) filter is disposed at every other picture element, and an R (red) filter and a B (blue) filter are respectively interposed between the neighboring G filters and respectively disposed at every other line, thus forming so-called Bayer array. FIG. 1 is a cross-sectional view taken along the line A-A' of FIG. 3.

Figure 2D:
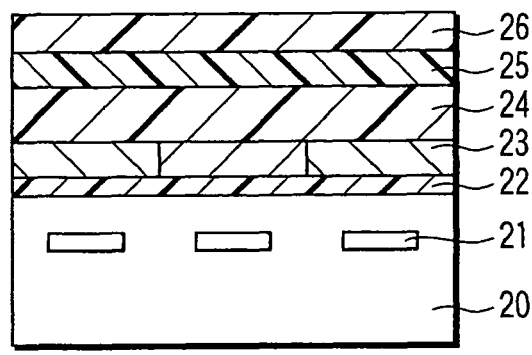
FIG. 2D is a cross-sectional view illustrating one step in the manufacturing method of a solid state imaging device according to one embodiment of the present invention.

Thereafter, a coating solution of thermosetting acrylic resin employed for example as a transparent resin is coated on the color filter 23 to form a transparent resin layer 24 for forming transfer lenses. Further, an etching control layer 25 to be etched at an etching rate different from the etching rate of the transparent resin layer is formed on the transparent resin layer 24. Then, a photosensitive resin layer 26 which is alkali-soluble and heat-flowable for forming a lens master is formed on the etching control layer 25 (FIG. 2D).

As for specific examples of the resin which is useful for forming the transparent resin layer to be employed for forming transfer lenses, they include acrylic resin, fluorine-based acrylic resin, epoxy resin, polyester resin, urethane resin, melamine resin, urea resin, styrene resin, phenolic resin and copolymers of these resins. Among these resins, it is more preferable to employ heat-resistive acrylic resin or fluorine-based acrylic resin having a low refractive index. These resins can be employed singly or as a mixture of two or more kinds.

Herein, the term "fluorine-based acrylic resin" is intended to include fluorinated acrylic resin, a blend of acrylic resin with a resin having a fluorine-containing group which is effective in lowering the refractive index, and a resin comprising the aforementioned fluorinated acrylic resin or the aforementioned blend, to which a silicon-based surfactant or a fluorine-based surfactant is added as a compound of low refractive index. These resins may be employed singly or additives may be incorporated into these resins if required. As for this fluorine-based acrylic resin, it is possible to employ, for example, MFS 179 (product name, Nippon Kayaku Co., Ltd.).

The transparent resin layer for forming transfer lenses according to this embodiment should preferably include a compound having a refractive index of 1.47 or less in order to decrease the reflectance thereof and to minimize the surface reflection of light. Ordinary, the aforementioned acrylic resin or styrene resin, each having a refractive index of about 1.5-1.6, is generally employed as the transparent organic resin for forming the micro lens or the planarization layer to be used in a solid state imaging device.

Especially, since the fluorinated acrylic resin which is useful for forming the transfer lenses for a solid state imaging device has a refractive index ranging from 1.38 to 1.47 in practical viewpoint, it would be possible to obtain especially desirable effects by the addition of a compound having a refractive index of not more than 1.47. Incidentally, since fluorine-based acrylic resin having a refractive index of 1.37 or less is poor in film-forming properties in terms of non-uniformity, cissing, low-adhesion, etc., the employment thereof is impractical.

As for the compound having a refractive index of not more than 1.47, it is possible to employ a silicon compound or a fluorine compound. As for the compound having a refractive index of not more than 1.47 which is useful in this embodiment, it is preferable to employ those exhibiting a high transmittance in the visible region (within the range of 400 nm-700 nm in wavelength of light) and an excellent heat resistance. More specifically, as described above, it is possible to optionally select those having a refractive index of not more than 1.47 among the silicon-based surfactant and the fluorine-based surfactant.

The mixing ratio of the compound having a refractive index of not more than 1.47 to the transparent resin layer for constituting transfer lenses should preferably be 0.2% by weight or more based on the quantity of the transparent resin layer (solid content). Because, when this compound is added to the transparent resin layer at a ratio of 0.2% by weight, it is possible to effectively enhance the smoothness of the transfer lens. When this compound is constituted by a silicon-based surfactant or a fluorine-based surfactant, both being not reactive with the transparent resin layer, the upper limit of the mixing ratio of these surfactants would be about 10% by weight. Incidentally, if the hardness of the transfer lens is not required to be taken into account, these surfactants may be added at a mixing ratio of more than 10% by weight.

As for specific examples of the resin which are useful for forming the etching control layer in this embodiment, they include acrylic resin, epoxy resin, polyester resin, urethane resin, melamine resin, urea resin, styrene resin, phenolic resin, polyimide resin and copolymers of these resins. Among them however, the employment of polystyrene resin or phenolic resin, both low in etching rate, is more preferable. It is also preferable that the etching control layer is incorporated with a resin containing a group excellent in dry etching resistance (small in etching rate) or having a skeleton having a benzene ring or aromatic ring or with a curing agent having a benzene ring. It is possible, through the addition of these resins or curing agent, to decrease the etching rate of the etching control layer and to work the transparent resin layer into lens of suitable size without excessively enlarging the thickness in configuration of lens to be transferred onto the underlying acrylic transparent resin layer.

The resin which is useful for forming the etching control layer according to this embodiment may be either a photosensitive organic resin or a thermosetting organic resin. As for the material for imaging device, it may be selected from a material which is capable of optimizing the process for forming the transfer lenses and a material which is relatively small in etching rate. The height of the transfer lens can be optionally adjusted by suitably changing the kind of resin to be used for forming the etching control layer without necessitating changing of the material for the photosensitive resin layer for forming the lens master or changing of the material for the transparent resin layer for forming the transfer lenses. Likewise, the height of the transfer lens can be optionally altered by suitably changing the film thickness of the etching control layer. Therefore, it is possible to form micro lens differing in focal distance corresponding to a specific solid state imaging device.

Incidentally, when fluorine-based acrylic resin is to be employed in particular as the transparent resin layer for forming the transfer lenses, there will be raised a problem that it is difficult to steadily work the transfer lenses by using heating flow of resin at the surface thereof because of the fact that the fluorine-based acrylic resin is liable to cause foreign matters on the surface thereof to relatively easily run away. Therefore, it is preferable to dispose a layer having a function for control heating flow of resin as an underlying layer of the lens master. The term "function for control heating flow of resin" employed herein is intended to indicate the capability of controlling the fluidity of a rectangular heat-flowable resin material (i.e., a photosensitive resin layer formed on the etching control layer) deposited on the aforementioned layer to thereby secure the round smooth configuration and dimensional stability by retaining a suitable flow quantity of lens-forming material without generating the cissing thereof on the occasion of heating flow of resin. The term "flow quantity" employed herein means an increase in thickness of lens as a result of the flow of lens material on the occasion of heating and melting (flowing) of the pattern of lens after the development of the pattern for making the lens round in configuration. Therefore, when the flow quantity is mentioned as 0.1 µm on one side, it means that a rectangular photosensitive resin layer 0.35 µm in height and 2 µm in width for example is transformed into a lens master 2.2 µm in side length as the photosensitive resin layer is heated to flow by a distance of 0.1 µm at each side thereof. Herein, a suitable flow quantity is confined to the range of 0.1-0.15 µm on each side, so that when a rectangular photosensitive resin layer is transformed into a lens master, the height of the lens is increased to about 1.3 times, the height of the photosensitive resin layer.

In this embodiment, since an etching control layer which can be etched at a lower etching rate than the etching rate of the resin layer constituting the lens master is disposed, it is possible to control the heating flow lens and also to ultimately suppress the surface roughness of the resin of low refractive index (fluorine-based acrylic resin), thereby making it possible to secure a narrow gap of not more than 0.35 µm in the transfer lenses.

Namely, since an etching control layer of low etching rate is disposed, it is possible to form an intermediate micro lens which is substantially free from surface roughness. Further, since a pattern of this intermediate micro lens which is substantially free from surface roughness is transferred onto the transparent resin layer, it is possible to obtain transfer lens which is substantially free from surface roughness and minimal in inter-lens gap. Additionally, since a pattern of lens master is transferred onto the etching control layer of low etching rate, the inter-lens gap can be confined to not more than 0.35 µm in a state of the intermediate micro lens. Since a pattern of this intermediate micro lens is transferred onto the transparent resin layer, it is possible to obtain transfer lenses having an inter-lens gap of not more than 0.35 µm.

Especially, since an etching control layer which can be etched at a lower etching rate than the etching rate of the transparent resin layer constituting the transfer lenses is disposed, it is possible to obtain transfer lens which is relatively low in aspect ratio, for example less than 0.14 in aspect ratio, and hence small in inter-lens gap.

In this embodiment, the term "heat-flowable resin material" for forming the lens master is employed to indicate a thermoplastic resin material which is capable of forming a curved surface through the surface tension of the resin material itself as it is thermally melted. As for specific examples this heat-flowable resin material, it is possible to employ acrylic resin, phenol resin and polystyrene resin, more preferably a resin which is photosensitive and can be formed into a pattern by way of alkaline development. Incidentally, if phenol resin is employed for forming the etching control layer which is an underlying layer of the lens master, the resin for constituting the lens master should preferably be selected from acrylic resin and polystyrene resin in view of the relationship of etching rates among these resins. To make the etching rate of the resin for the lens master lower than the etching rate of the etching control layer is preferable in viewpoint of decreasing the height (thickness) of the micro lens to be intermediately formed in the etching control layer as well as in viewpoint of minimizing the inter-lens gap.

Figure 2E:
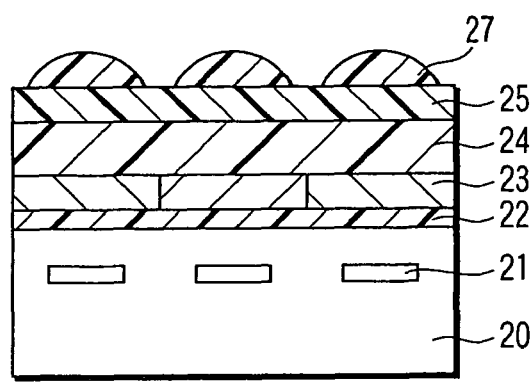
FIG. 2E is a cross-sectional view illustrating one step in the manufacturing method of a solid state imaging device according to one embodiment of the present invention.

Then, the photosensitive resin layer 26 is subjected, through a photomask, to exposure to light and to development using an alkaline developing solution to form a rectangular pattern corresponding to the photoelectric conversion devices. The resultant pattern is then heat-treated to form a lens master 27 (FIG. 2E).

Figure 2F:
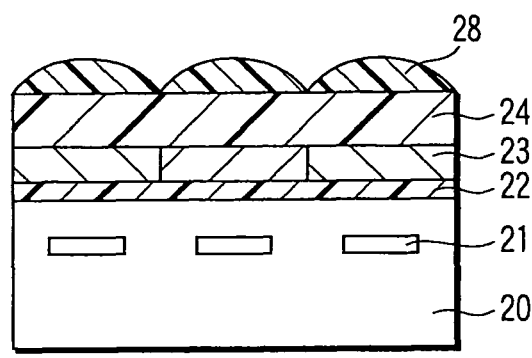
FIG. 2F is a cross-sectional view illustrating one step in the manufacturing method of a solid state imaging device according to one embodiment of the present invention.

Subsequently, by using the lens master 27 as an intermediate mask, the etching control layer 25 is subjected to dry etching to form an intermediate micro lens 28 (FIG. 2F).

The etching control layer 25 to be employed in this embodiment is useful in controlling the fluidity of the lens master on the occasion of heating flow of resin, in securing a round smooth configuration and dimensional stability of the lens, in adjusting the height of lens on the occasion of dry etching as described above (i.e., adjustment to decrease the height of lens in advance so as to prevent the height of lens from becoming too high on the occasion of dry etching acrylic resin), and in minimizing the inter-lens gap.

Figure 2G:
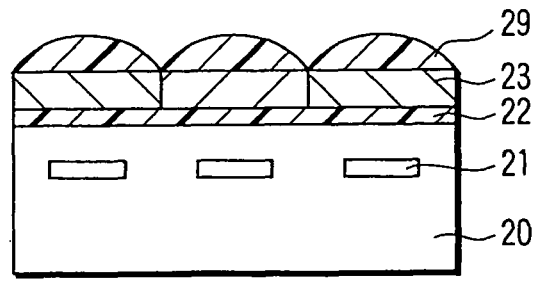
FIG. 2G is a cross-sectional view illustrating one step in the manufacturing method of a solid state imaging device according to one embodiment of the present invention.

Finally, by dry etching, the pattern of the intermediate micro lens 28 is transferred onto the transparent resin layer 24 to form transfer lenses 29, thus accomplishing a solid state imaging device (FIG. 2G).

The dry etching to be employed in the present invention may be performed by using various kinds of dry etching methods and apparatus such as ECR, parallel plate magnetron, DMR, ICP and double-frequency type RIE.

As for the gas to be employed in the dry etching, there is not any specific limitation as long as it is capable of exhibiting reactivity (oxidizing or reducing property). For example, it is possible to employ gas containing, in its construction, halogen elements such as fluorine, chlorine, bromine, etc., or gas containing, in its construction, oxygen or sulfur element. It is also possible to employ various kinds of gas other than those mentioned above.

However, it is practically preferable, in viewpoint of influences on human body, to employ fluorocarbon-based gas which is low in toxicity.

The fluorocarbon-based gas should be selected from those which are capable of satisfying all of the conditions in realizing excellent properties with regard to the surface roughness on the occasion of forming transfer lenses, inter-lens gap, the cross-sectional configuration of lens, etching rates, etc. If the effects on narrowing gap between lens which is an important factor in the formation of transfer lenses are taken into account, it is more preferable to select, among the fluorocarbon-based gas, a kind of gas where the atomic percent of C relative to the atomic percent of F is higher such as $C_3F_8$, $C_4F_8$, etc., rather than $CF_4$, this kind of gas being effective in more easily obtaining the CD gain of transfer lenses (the effects on narrowing gap between lenses). However, in the case of the manufacturing method where the aforementioned etching control layer is not employed, if these gases are employed singly, various problems would be raised. For example, the surface of lens would be greatly roughened, the etching rate would deteriorate, and abnormal configuration in cross-section of lens would be generated.

For example, if $CF_4$ gas is employed singly, the effects on narrowing gap between lens would be insufficient. If $C_3F_8$ gas is employed singly, the etching rate would deteriorate or the cross-sectional configuration of lens would become triangular. If $C_4F_8$ gas is employed singly, the etching rate would be deteriorated or the surface roughness of lens would become more prominent.

The addition of inert gas such as He, Ar, etc., or $O_2$ to the aforementioned fluorocarbon-based gas would be effective in enhancing the etching rate. However, the addition of inert gas or $O_2$ would more likely bring about side effects such as increase of inter-lens gap or increased surface roughness. However, when the aforementioned etching control layer is employed as described in this embodiment, these problems would be overcome.

In this embodiment, $CF_4$, $C_3F_8$ and $C_4F_8$ gas may be respectively employed singly as a dry etching gas. Especially, when a mixed gas comprising $C_3F_8$ and $C_4F_8$ is employed, it is possible to make the inter-lens gap substantially zero and at the same time, to form transfer lens which is substantially free from surface roughness.

As for the dry etching conditions on the occasion of forming the transfer lenses, since they are largely dependent on the apparatus to be employed, the conditions such as gas pressure, power, the flow rate of gas, the temperature of substrate, the distance between electrodes, the operating conditions of magnetron, etc., should be optimized in conformity with each apparatus, thus finding out optimal conditions.

Especially, when the mixing ratio of $C_3F_8$ and $C_4F_8$ in the mixed gas is confined within the range of: $C_3F_8:C_4F_8=5:1-1:9$, it is possible to obtain a micro lens which is substantially free from surface roughness of lens and high in light-condensing effects.

Further, when a mixed gas comprising $C_3F_8$ and $C_4F_8$ is employed as an etching gas, it is possible, even if the etching rate is increased, to suppress the surface roughness of lens. Therefore, in order to enhance the productivity, dry etching conditions (gas pressure, power, the flow rate of gas, the temperature of substrate, etc.) should preferably be adjusted so as to obtain an etching rate of 200-400 nm/min.

Incidentally, in order to improve the distribution of dry etching or the configuration of transfer lens on the occasion of dry etching, the semiconductor substrate to be employed may be heated or cooled.

In the method of manufacturing the solid state imaging device according to this embodiment, the etching rates of the transparent resin layer for forming the transfer lenses, of the etching control layer, and of the photosensitive resin for forming the lens master are important factors for obtaining transfer lens which is substantially free from surface roughness and small in inter-lens gap. Following table shows the kinds of resins of these layers, preferable ratios of etching rate, and preferable values of etching rate. Incidentally, the values of etching rate in the following table are reference values obtained under prescribed etching conditions.

TABLE 1

| | Ratio of etching rate | Etching rate |
| --- | --- | --- |
| Photosensitive resin for lens master (styrene resin) | 1 | 250 nm/min. |
| Etching control layer (phenol resin) | 0.08 to 1.0 | 225 nm/min. |
| Transparent resin layer for transfer lens (acrylic resin) | 1.1 to 1.3 | 300 nm/min. |
| Transparent resin layer for transfer lens (fluorine-based acrylic resin) | 1.2 to 1.8 | 375 nm/min. |

When the materials of the transparent resin layer for forming the transfer lenses, of the etching control layer, and of the photosensitive resin for forming the lens master as well as the etching conditions are suitably selected so that the etching rates thereof can be confined within the ranges described in the table, it is possible to obtain transfer lens which is substantially free from surface roughness and small in inter-lens gap.

Figure 4:
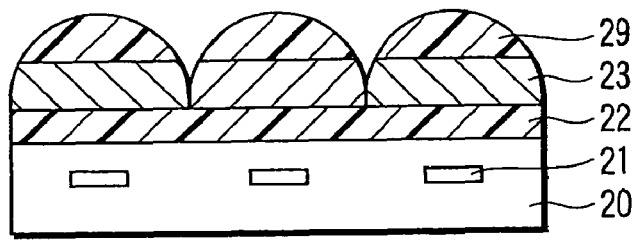
FIG. 4 is a partially sectioned view of a solid state imaging device according to another embodiment of the present invention.

Incidentally, although the transfer lens 29 may be formed by using only the transparent resin layer, it would be preferable, as shown in FIG. 4, to form a central portion of the transfer lens by using the transparent resin layer and to form a peripheral portion thereof by using an upper portion of the color filter 23, thereby making it possible to shorten the distance between lenses and to enlarge the light-uptake angle of the imaging device.

Figure 5:
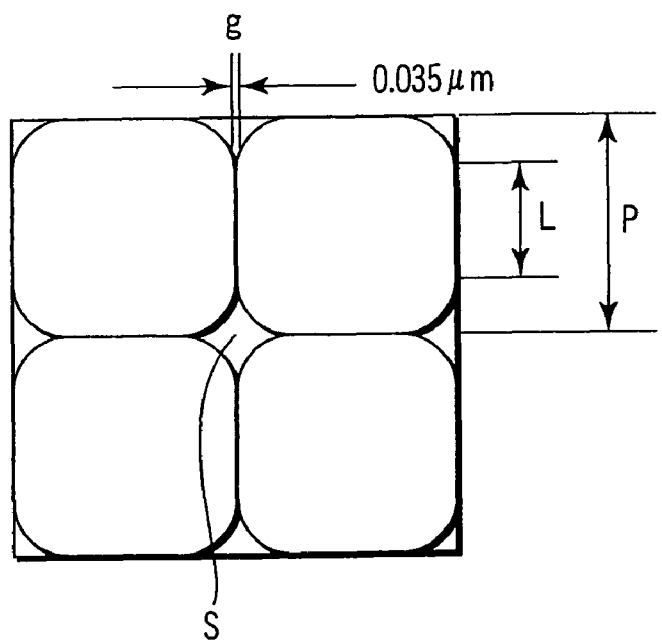
FIG. 5 is a plane view illustrating part of the solid state imaging device shown in FIG. 1.

As shown in FIG. 5, in the transfer lenses of the solid state imaging device to be employed as described above according to this embodiment, the gap g between the neighboring transfer lenses is not more than 0.035 μm which is a measurable limit of the end measuring SEM and the contact length L between the neighboring transfer lenses keeping this gap is confined to fall within the range of 3-80% of the pitch P (the size of picture element) of the transfer lenses.

As described above, since the gap g between the neighboring transfer lenses is relatively small and the contact length L between transfer lenses is relatively large, it is possible to obtain a solid state imaging device having a micro lens which is large in aperture ratio and excellent in sensitivity.

Incidentally, by the expression of "the gap g between the neighboring transfer lenses is not more than 0.035 μm which is a measurable limit of the end measuring SEM", it is intended to mean that the neighboring transfer lenses are substantially contacted with each other. Further, when the contact length L between the neighboring transfer lenses is confined to 3% of the pitch (the size of picture element) of the transfer lenses, the aperture ratio of lens would become about 80%, whereas when the contact length L is confined to 80% of the pitch (the size of picture element) of the transfer lenses, the aperture ratio of lens would become about 98%.

When this contact length L is confined within the aforementioned range, even if a slight degree of vacant space S is permitted to remain at diagonal portions, since these portions are useless in converging light, it would be sufficient if this contact length L is confined to fall within the range of 3-80% of the pitch (the size of picture element) of the transfer lenses.

Incidentally, the variation in diameter of the transfer lens after the etching in comparison with that of the master of heating flow lens is referred to as CD gain, so that when this CD gain is high, it is possible to realize the effects of narrowing the gap between neighboring transfer lenses. For example, when the CD gain is assumed as being X, this indicates that the diameter of transfer lens is increased by a magnitude of X as compared with the diameter of heating flow lens, so that if the inter-lens gap of heating flow lens is assumed as being Y, it is possible to decrease the gap between transfer lenses down to a magnitude of (X-Y).

Further, according to this embodiment, the surface roughness (Ra) of the transfer lens of the solid state imaging device can be confined to 50 nm or less. If the surface roughness (Ra) of the transfer lens is larger than 50 nm, the scattering of visible light would be likely to generate, thus more likely giving rise to the loss of light.

In the manufacturing method of the solid state imaging device according to this embodiment as described above, since the etching control layer is disposed, it is possible to suppress the surface roughness (Ra) of transfer lens to not more than 50 nm even if acrylic resin or fluorine-based acrylic resin, both considered more likely to generate surface roughness, is employed as the transparent resin layer for constituting the transfer lenses.

Although it is not necessarily made clear with respect to the mechanism of minimizing the surface roughness of transfer lens in the present invention, it is conceivable that perhaps, the following phenomenon plays an important role in the mechanism. Namely, it is quite conceivable that when an organic film is subjected to a dry etching treatment in vacuum, ordinarily only the surface of the organic film is attacked, resulting in the generation of non-uniform decomposition and cross-linking of resin, thus generating rumples on the surface of the organic film due to stress relaxation on this occasion, or resulting in the generation of microscopically non-uniform etching, thus allowing the molecules of the surface of resin to move due to the decomposition or cross-linking of the molecules, thereby resulting in the formation of rugged surface.

Whereas, when the etching control layer which is low in etching rate is disposed as described above, it is possible to form an intermediate micro lens which is substantially free from surface roughness, and when the pattern of this intermediate micro lens is transferred onto the transparent resin layer, it is possible to form transfer lens which is substantially free from surface roughness.

Next, various examples of the present invention and comparative examples will be explained.

Example 1

The manufacturing method of the solid state imaging device according to this example will be explained with reference to FIGS. 2A-2G and 3.

As shown in FIG. 2A, a semiconductor substrate 20 having photoelectric conversion devices 21, a light-shielding film and a passivation layer (not shown) all formed therein was provided, and a planarization layer 22 was formed on the semiconductor substrate 20 by a spin-coating method using a coating solution of thermosetting type acrylic resin (FIG. 2B).

Then, as shown in FIG. 2C, a color filter 23 was formed by repeating photolithography three times for providing three colors, i.e., green, blue and red.

The green resist was prepared as follows. Namely, C.I. Pigment Yellow 139, C.I. Pigment Green 36 and Pigment Blue 15:6 were employed as coloring materials to form a mixture, to which an organic solvent such as cyclohexanone and PGMEA, a polymeric varnish, a monomer and an initiator were added to form the green resist.

The blue resist was prepared as follows. Namely, C.I. Pigment Blue 15:6 and Pigment violet 23 were employed as coloring materials to form a mixture, to which an organic solvent such as cyclohexanone and PGMEA, a polymeric varnish, a monomer and an initiator were added to form the blue resist.

The red resist was prepared as follows. Namely, C.I. Pigment Red 117, C.I. Pigment Red 48:1 and Pigment Yellow 139 were employed as coloring materials. Additives other than the coloring materials were the same as those of the green resist.

Then, as shown in FIG. 2D, a coating solution of acrylic resin having a benzene ring introduced into the skeleton thereof was coated on the color filter 23 to form a transparent resin layer 24 having a film thickness of 1 μm and heated for 3 minutes at a temperature of 180° C. to perform a film-hardening treatment. The refractive index, after the film-hardening treatment, of the transparent resin constituting the transfer lenses 29 was 1.51.

Then, phenol resin was coated to a thickness of 1 μm to thereby form an etching control layer 25 and furthermore, styrene resin which was alkali-soluble, photosensitive and heat-flowable was coated to form a photosensitive resin layer 26.

Subsequently, as shown in FIG. 2E, the photosensitive resin layer 26 was subjected to a known photolithographic process to form a rectangular pattern, which was then heat-treated at a temperature of 200° C. to generate heating flow of resin, thereby forming a lens master 27 at an approximately suitable flow quantity of 0.1 μm on one side. Incidentally, the lens master 27 was a smooth semi-spherical lens 0.5 μm in height and 0.3 μm in gap between the lens masters.

Then, by dry etching using a mixed gas consisting of $CF_4$ and $C_3F_8$ both fluorocarbon gas, the pattern of the lens master 27 was transferred onto the etching control layer 25 made of phenolic resin to form intermediate micro lenses 28 having an inter-lens gap of 0.035 μm as shown in FIG. 2F. The height of these intermediate micro lenses 28 was about 0.45 μm which was lower than the height of the lens master 27. Incidentally, the time for the dry etching was set to 5 minutes.

Finally, by using fluorocarbon gas $C_3F_8$ as an etching gas, the transparent resin layer 24 was subjected to dry etching treatment with the intermediate micro lenses 28 being employed as a mask to form transfer lenses 29 as shown in FIG. 2G, thereby manufacturing a solid state imaging device having a picture element size of 2.5 μm×2.5 um. Incidentally, the time for the dry etching was set to 5 minutes.

Incidentally, the etching rate of the transparent resin layer employed in Example 1 was 1.1 times as large as the etching rate of the styrene resin constituting the lens master. On the contrary, the etching rate of the phenolic resin constituting the etching control layer was 0.9 times the etching rate of the styrene resin constituting the lens master.

The height of transfer lenses 29 of the solid state imaging device thus obtained was 0.55 μm.

Figure 6:
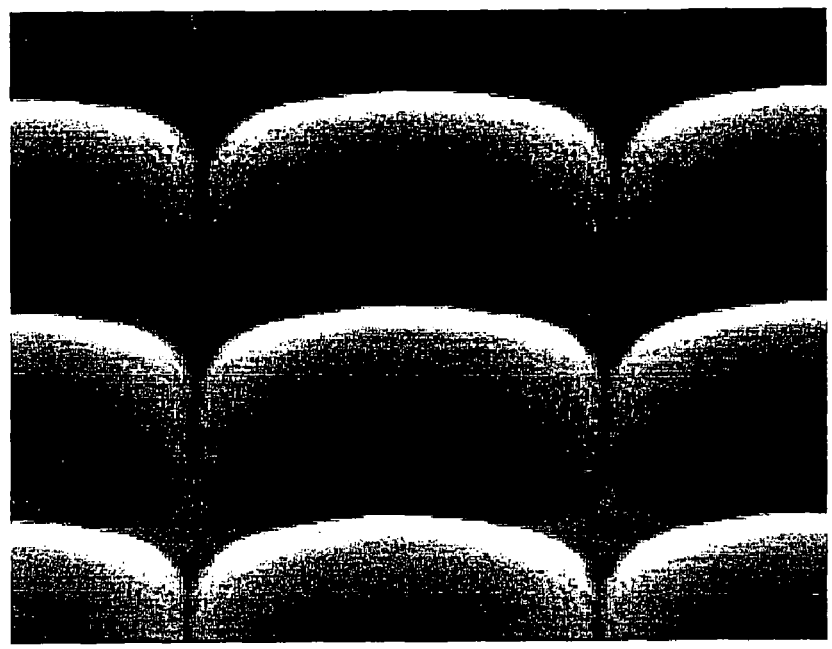
FIG. 6 is an SEM photograph of the surface of transfer lenses which were formed in Example 1.

FIG. 3 shows a plane view of the transfer lenses 29 obtained according to Example 1 and FIG. 6 shows an SEM image. It was possible to confirm from FIG. 6 that the surface roughness of the transfer lenses 29 was not more than 10 nm, indicating a very clear surface, and the inter-lens gap was not more than 0.035 μm, thus confirming that the lenses were worked realizing a narrow gap which was confined to not more than the measurable limit of SEM. Further, since a resin differing in etching rate from the etching rate of the transparent resin layer was employed as the etching control layer, it was possible to form transfer lenses which were lower in height and smaller in inter-lens gap as compared with the case where the lens master was directly formed on the transparent resin layer.

Moreover, since acrylic resin having a benzene ring was employed in the formation of the transparent resin layer, it was possible to make smooth the surface of transfer lens, thus minimizing the surface roughness.

Comparative Example 1

A solid state imaging device was formed with the conditions such as materials, the size of picture element and steps being kept the same as described in Example 1 except that the dry etching was performed using a mixed gas consisting of $CF_4$ and $C_3F_8$ without forming the etching control layer 25.

The height of transfer lenses of the solid state imaging device thus obtained was 0.55 μm.

Figure 7:
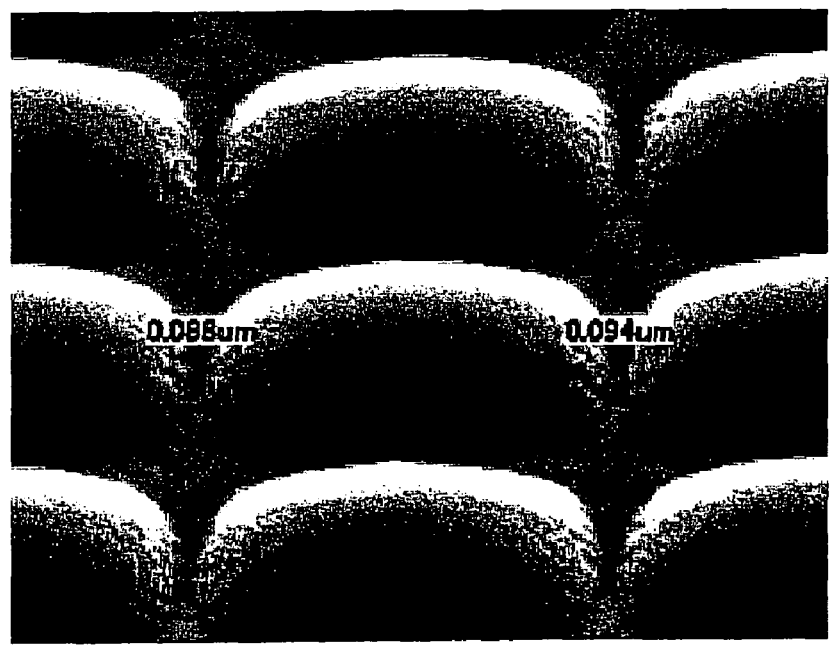
FIG. 7 is an SEM photograph of the surface of transfer lenses which were formed in Comparative Example 1.

FIG. 7 shows an SEM image of the transfer lenses according to COMPARATIVE EXAMPLE 1. It was possible to confirm from FIG. 7 that the surface roughness of the transfer lenses was as large as 55 nm and the inter-lens gap was also as large as 0.09 μm.

Example 2

A solid state imaging device was formed with the conditions such as materials, the size of picture element and steps being kept the same as described in Example 1 except that acrylic resin having no benzene ring introduced therein was employed as a resin for constituting the transparent resin layer 24 and the dry etching was performed using a mixed gas consisting of $CF_4$ and $C_3F_8$ for the formation of the intermediate micro lens and for the formation of the transfer lenses. The refractive index, after the film-hardening treatment, of the transparent resin constituting the transfer lenses was 1.55.

Incidentally, the etching rate of the transparent resin layer employed in Example 2 was 1.2 times as large as the etching rate of the styrene resin constituting the lens master.

The height of transfer lenses of the solid state imaging device thus obtained was 0.6 μm. It was possible to confirm from the SEM image of transfer lenses of Example 2 that the surface roughness of the transfer lenses was 60 nm, indicating a roughened surface. However, the inter-lens gap was confined to not more than 0.035 µm, thus confirming that the lenses were worked realizing a narrow gap which was confined to not more than the measurable limit of SEM.

Example 3

A solid state imaging device was formed with the conditions such as materials, the size of picture element and steps being kept the same as described in Example 1 except that fluorine-based acrylic resin having a refractive index of 1.45 was employed as a resin for constituting the transparent resin layer 24 and a fluorine-based surfactant having a refractive index of 1.41 (Megafac BL-20 [trade name]; Dainippon Ink Chemical Industries Co., Ltd.) was added to the coating solution at a ratio of 3% by weight (calculated as solid content). The refractive index, after the film-hardening treatment, of the transparent resin constituting the transfer lenses was 1.44.

Incidentally, the etching rate of the transparent resin layer employed in Example 3 was 1.6 times as large as the etching rate of the styrene resin constituting the lens master.

The height of transfer lenses of the solid state imaging device thus obtained was 0.64 µm. It was possible to confirm from the SEM image of transfer lenses of Example 3 that the surface roughness of the transfer lenses was 40 nm, indicating a smooth surface. The inter-lens gap was confined to not more than 0.035 µm, thus confirming that the lenses were worked realizing a narrow gap which was confined to not more than the measurable limit of SEM.

Since the fluorine-based surfactant, i.e. a fluorine compound, was incorporated into the transparent resin layer, it was possible to make smooth the surface of transfer lens and to suppress the surface roughness thereof even if fluorine-based acrylic resin, which was relatively large in etching rate and likely to generate surface roughness due to dry etching, was employed as the transparent resin layer. Furthermore, since the fluorine-based surfactant is a compound which is low in refractive index, it was possible to lower, more or less, the refractive index of the transparent resin layer employed for constituting the transfer lenses rather than increasing the refractive index thereof. Because of this, it was possible to suppress the reflectance much more as compared with the micro lens formed by using a transparent resin layer containing no fluorinate compound. Moreover, since it was possible to suppress the re-reflection of light inside the solid state imaging device, it was possible to contribute to the enhancement of quality of image.

Example 4

A solid state imaging device was formed with the conditions such as materials, the size of picture element and steps being kept the same as described in Example 1 except that the time for the dry etching using $C_3F_8$ for forming the transfer lenses was extended from 5 to 6 minutes.

As a result, it was possible to further etch away the color filter 23 located below the transparent resin layer by a depth of about 0.15 µm, thereby making it possible to proportionally shorten the distance below the micro lens (a distance from the underside of the transfer lens to the photoelectric conversion device).

The height of transfer lenses of the solid state imaging device thus obtained was 0.55 µm. It was possible to confirm from the SEM image of transfer lenses of Example 4 that, as in the case of Example 1, the surface roughness of the transfer lenses was 10 nm or less, indicating a very smooth surface. The inter-lens gap was confined to not more than 0.035 µm, thus confirming that the lenses were worked realizing a narrow gap which was confined to not more than the measurable limit of SEM.

Example 5

A solid state imaging device was formed with the conditions such as materials, the size of picture element and steps being kept the same as described in Example 1 except that a benzotriazole-based light stabilizer (Adecacruse DN [trade name]; Asahi Denka Industries Co., Ltd.) was added to a coating solution of acrylic resin employed as a resin for forming the transparent resin layer at a ratio of 2% by weight (calculated as solid content). The benzotriazole-based light stabilizer employed herein was an organic compound having a benzene ring. The refractive index, after the film-hardening treatment, of the transparent resin constituting the transfer lenses was 1.54.

Incidentally, the etching rate of the transparent resin layer employed in Example 5 was 1.1 times as large as the etching rate of the styrene resin constituting the lens master.

The height of transfer lenses of the solid state imaging device thus obtained was 0.55 µm. It was possible to confirm from the SEM image of transfer lenses of Example 5 that the surface roughness of the transfer lenses was 10 nm or less, indicating a very smooth surface. The inter-lens gap was confined to not more than 0.035 µm, thus confirming that the lenses were worked realizing a narrow gap which was confined to not more than the measurable limit of SEM.

Since the benzotriazole-based light stabilizer, i.e., a fluorine compound or an organic compound having a benzene ring, was incorporated into the transparent resin layer, it was possible to make smooth the surface of transfer lens and to suppress the surface roughness thereof.

Example 6

The manufacturing method of the solid state imaging device according to this embodiment will be explained with reference to FIGS. 8A-8E.

Figure 8A:
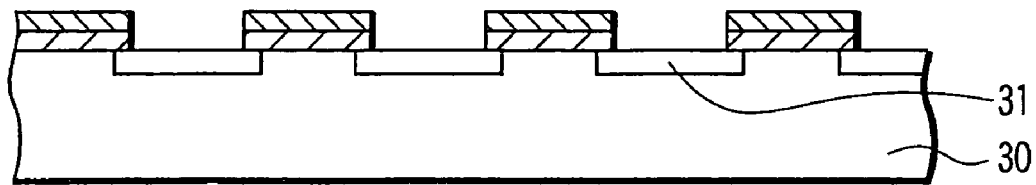
FIG. 8A is a cross-sectional view illustrating one step in the manufacturing method of a solid state imaging device according to Example 6.
Figure 8B:
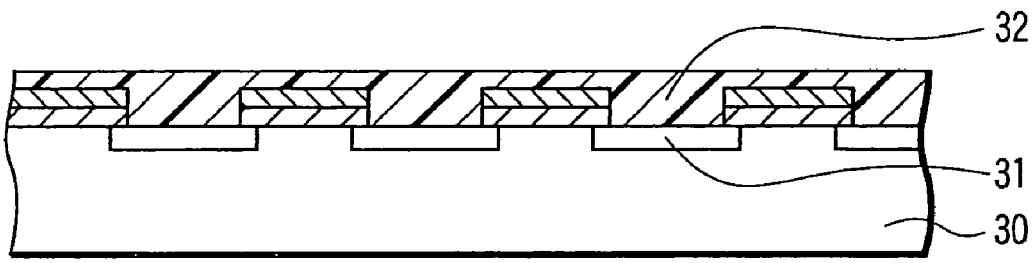
FIG. 8B is a cross-sectional view illustrating one step in the manufacturing method of a solid state imaging device according to Example 6.

As shown in FIG. 8A, a semiconductor substrate 30 having photoelectric conversion devices 31, a light-shielding film and a passivation layer (not shown) all formed therein was provided, and a planarization layer 32 was formed on the semiconductor substrate 30 by means of spin-coating method using a coating solution of thermosetting type acrylic resin (FIG. 8B).

Figure 8C:
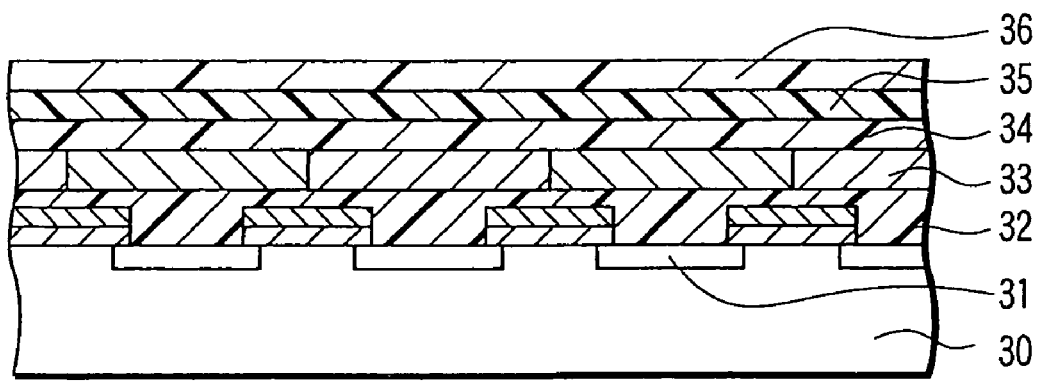
FIG. 8C is a cross-sectional view illustrating one step in the manufacturing method of a solid state imaging device according to Example 6.

Then, in the same manner as described in Example 1 and as shown in FIG. 8C, a color filter 33 was formed by repeating photolithography three times and using three kinds of color resists (a green resist, a blue resist and a red resist) for providing three colors, i.e. green (G), blue (B) and red (R).

Then, fluorine-based acrylic resin having a refractive index of 1.45 and exhibiting an etching rate of 370 nm/min. was coated on the color filter 33 to form a transparent resin layer 34 having a film thickness of 1 µm and heated for 3 minutes at a temperature of 180° C. to perform a film-hardening treatment. The refractive index, after the film-hardening treatment, of the transparent resin layer constituting a central portion of the transfer lenses 38 was 1.45.

Then, styrene resin exhibiting an etching rate of 210 nm/min. was coated to a thickness of 1 µm to thereby form an etching control layer 35 and furthermore, acrylic resin which was alkali-soluble, photosensitive and heat-flowable was coated to form a photosensitive resin layer 36.

Figure 8D:
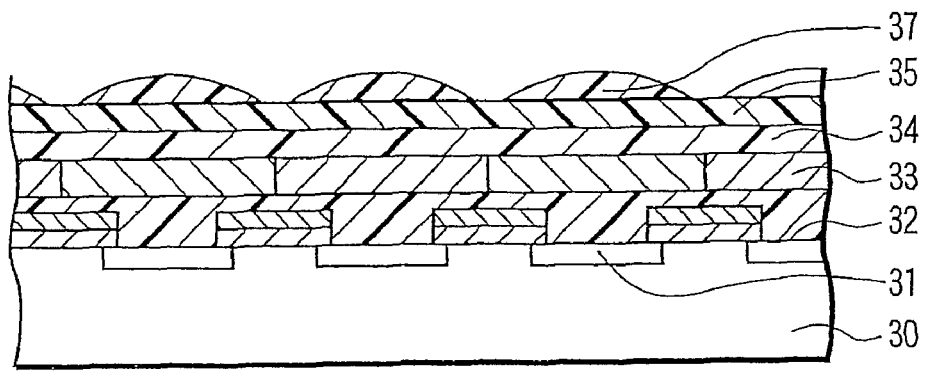
FIG. 8D is a cross-sectional view illustrating one step in the manufacturing method of a solid state imaging device according to Example 6.

Subsequently, as shown in FIG. 8D, the photosensitive resin layer 36 was subjected to a known photolithographic process to form a rectangular pattern, which was then heat-treated at a temperature of 200° C. to generate heating flow of resin, thereby forming a lens master 37 at an approximately suitable flow quantity of 0.1 μm on one side. Incidentally, the lens master 37 was a smooth semi-spherical lens 0.45 μm in height and 0.3 μm in gap between the lens masters.

Figure 8E:
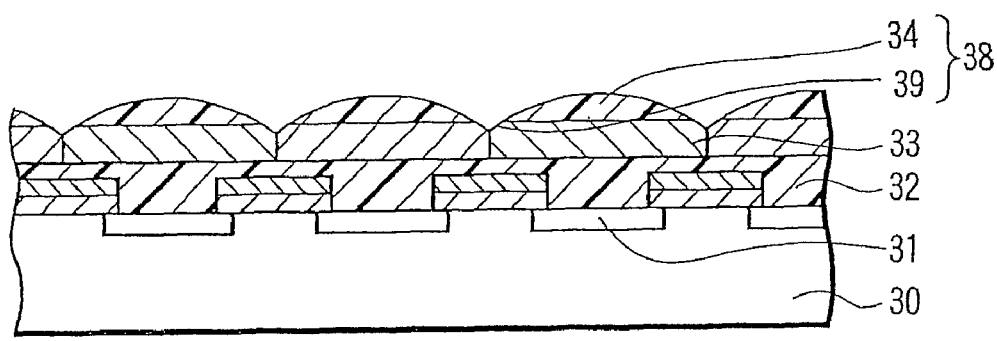
FIG. 8E is a cross-sectional view showing the solid state imaging device manufactured according to Example 6.

Finally, by dry etching using a mixed gas consisting of $CF_4$ and $C_3F_8$ both fluorocarbon gas, the etching control layer 35 was etched with the lens master 37 being employed as a mask to form intermediate micro lenses. Then, by using this intermediate micro lenses consisting of the etching control layer as a mask, the transparent resin layer 34 was subjected to etching treatment. Further, the color filter 33 was etched away to a depth of 0.15 μm to form transfer lenses 38 as shown in FIG. 8E. This transfer lenses 38 were then heated for 18 minutes at a temperature of 230° C. to completely cure the transfer lenses 38, thereby manufacturing a solid state imaging device having a picture element size of 2.5 μm×2.5 μm. The transfer lenses 38 according to Example 6 were constructed such that a central portion thereof was constituted by the transparent resin layer 34 and a peripheral portion 39 thereof was constituted by an upper portion of the color filter 33.

Incidentally, the etching rate of the transparent resin layer employed in Example 6 was 1.5 times as large as the etching rate of the acrylic resin constituting the lens master. On the contrary, the etching rate of the styrene resin constituting the etching control layer was as small as 0.84 times the etching rate of the acrylic resin constituting the lens master.

The height of transfer lenses of the solid state imaging device thus obtained was 0.675 μm. It was possible to confirm from the SEM image of transfer lenses of Example 6 that, although the surface roughness of the transfer lenses was 70 nm or less, indicating a roughened surface, the inter-lens gap was confined to not more than 0.035 μm, and the lenses were worked realizing a narrow gap which was confined to not more than the measurable limit of SEM. Further, since a resin which was smaller in etching rate as compared with the etching rate of the transparent resin layer was employed as the etching control layer, it was possible not only to lower the height of transfer lens but also to form transfer lenses where the inter-lens gap was very small even if the etching rate of the transparent resin layer was larger as compared with the etching rate of the lens master.

Example 7

A solid state imaging device was formed with the conditions such as materials, the size of picture element and steps being kept the same as described in Example 6 except that fluorine-based acrylic resin having a refractive index of 1.45 was employed as a resin for constituting the transparent resin layer 34, that a fluorine-based surfactant having a refractive index of 1.41 (Megafac BL-20 [trade name]; Dainippon Ink Chemical Industries Co., Ltd.) was added to the coating solution at a ratio of 3% by weight (calculated as solid content), and that the styrene resin employed for forming the etching control layer was replaced by phenolic resin which was formed into a layer having a film thickness of 0.6 μm. The refractive index, after the film-hardening treatment, of the transparent resin constituting the transfer lenses was 1.44.

Incidentally, the etching rate of the transparent resin layer employed in Example 7 was 1.25 times as large as the etching rate of the acrylic resin constituting the lens master. On the contrary, the etching rate of the phenolic resin constituting the etching control layer was as small as 0.8 times the etching rate of the acrylic resin constituting the lens master.

Figure 9:
FIG. 9 is an SEM photograph of the surface of transfer lenses which were formed in Example 7.

The height of transfer lenses of the solid state imaging device thus obtained was 0.56 μm. FIG. 9 shows an SEM image of the transfer lenses which were formed in Example 7. It was possible to confirm from FIG. 9 that the surface roughness of the transfer lens was 40 nm, indicating a smooth surface and the inter-lens gap could be confined to not more than 0.035 μm, thus indicating the possibility of working of the lenses with a narrow gap which was confined to not more than the measurable limit of SEM.

Since the fluorine-based surfactant, i.e., a fluorine compound, was incorporated into the transparent resin layer, it was possible to make smooth the surface of transfer lens and to suppress the surface roughness thereof even if fluorine-based acrylic resin, which was relatively large in etching rate and likely to generate surface roughness due to dry etching, was employed as the transparent resin layer. Furthermore, since the fluorine-based surfactant is a compound which is low in refractive index, it was possible to lower, more or less, the refractive index of the transparent resin layer employed for constituting the transfer lenses rather than increasing the refractive index thereof. Because of this, it was possible to suppress the reflectance much more as compared with the micro lens formed by using a transparent resin layer containing no fluorinate compound. Moreover, since it was possible to suppress the re-reflection of light inside the solid state imaging device, it was possible to contribute to the enhancement of quality of image.

Example 8

A solid state imaging device was formed with the conditions such as materials, the size of picture element and steps being kept the same as described in Example 6 except that a thermosetting acrylic resin having a refractive index of 1.55 was employed as a resin for constituting the transparent resin layer 34, that a silicon-based surfactant having a refractive index of 1.42 (FZ2122 [trade name]; Nippon Unicar Co., Ltd.) was added to the coating solution thereof at a ratio of 3% by weight (calculated as solid content), and that the styrene resin employed for forming the etching control layer was replaced by phenolic resin formed into a layer having a film thickness of 0.6 μm. The refractive index, after the film-hardening treatment, of the transparent resin constituting the transfer lenses was 1.54.

Incidentally, the etching rate of the transparent resin layer employed in Example 8 was the same as the etching rate of the acrylic resin constituting the lens master. On the contrary, the etching rate of the phenolic resin constituting the etching control layer was as small as 0.8 times the etching rate of the acrylic resin constituting the lens master.

The height of transfer lenses of the solid state imaging device thus obtained was 0.45 μm. It was possible to confirm from the SEM image obtained in Example 8 that the surface roughness of the transfer lens was 10 nm or less, indicating a very smooth surface and the inter-lens gap could be confined to not more than 0.035 μm, thus indicating the possibility of working of the lenses with a narrow gap which was confined to not more than the measurable limit of SEM. Further, since a resin which was smaller in etching rate as compared with the etching rate of the transparent resin layer was employed as the etching control layer, it was possible to form transfer lenses where the inter-lens gap was very small even if the etching rate of the transparent resin layer was the same as the etching rate of the lens master.

Since the silicon-based surfactant, i.e., a silicon compound, was incorporated into the transparent resin layer, it was possible, as in the case of Example 7, to make smooth the surface of transfer lens and to suppress the surface roughness thereof. Furthermore, since the silicon-based surfactant is a compound which is low in refractive index, it was possible to lower, more or less, the refractive index of the transparent resin layer employed for constituting the transfer lenses rather than increasing the refractive index thereof. Because of this, it was possible to suppress the reflectance to a half or less as compared with the micro lens formed by using a transparent resin layer containing no fluorinate compound. Moreover, since it was possible to suppress the re-reflection of light inside the solid state imaging device to a half or less, it was possible to contribute to the enhancement of quality of image.

Example 9

A solid state imaging device was formed with the conditions such as materials, the size of picture element and steps being kept the same as described in Example 6 except that the styrene resin employed for forming the etching control layer was replaced by phenolic resin formed into a layer having a film thickness of 0.6 µm. The refractive index, after the film-hardening treatment, of the transparent resin constituting the transfer lenses was 1.45.

Incidentally, the etching rate of the phenolic resin constituting the etching control layer employed in Example 9 was as small as 0.8 times the etching rate of the acrylic resin constituting the lens master.

The height of transfer lenses of the solid state imaging device thus obtained was 0.65 um. It was possible to confirm from the SEM image of the transfer lens obtained in Example 9 that the surface roughness of the transfer lens was 70 nm, indicating a roughened surface, but the inter-lens gap could be confined to not more than 0.035 µm, thus indicating the possibility of working of the lenses with a narrow gap which was confined to not more than the measurable limit of SEM. Further, since a resin which was smaller in etching rate as compared with the etching rate of the transparent resin layer was employed as the etching control layer, it was possible to lower the height of transfer lens and to form transfer lenses exhibiting very small inter-lens gap even if the etching rate of the transparent resin layer was larger than the etching rate of the lens master. Furthermore, since a resin which was different in etching rate from that of Example 6 was employed as the etching control layer, it was possible to optionally change the height of the transfer lens without necessitating changing of not only the material for the photosensitive resin layer for constituting the lens master but also the material for the transparent resin layer for constituting the transfer lenses.

Example 10

The manufacturing method of the solid state imaging device according to this embodiment will be explained with reference to FIGS. 10A-10F.

As shown in FIG. 10A, a semiconductor substrate 50 having photoelectric conversion devices 51, a light-shielding film and a passivation layer (not shown) all formed therein was provided, and a planarization layer 52 was formed on the semiconductor substrate 50 by a spin-coating method using a coating solution of thermosetting type acrylic resin (FIG. 10B).

Then, in the same manner as described in Example 1 and as shown in FIG. 10C, a color filter 53 was formed by repeating photolithography three times and using three kinds of color resists (a green resist, a blue resist and a red resist) for providing three colors, i.e. green (G), blue (B) and red (R).

Then, as shown in FIG. 10D, thermosetting type acrylic resin having a refractive index of 1.55 was coated on the color filter 53 to form a transparent resin layer 54 having a film thickness of 1 µm and heated for 3 minutes at a temperature of 180° C. to perform a film-hardening treatment. The refractive index, after the film-hardening treatment, of the transparent resin layer constituting a central portion of the transfer lenses 58 was 1.55.

Then, phenolic resin was coated to a thickness of 0.6 µm to thereby form an etching control layer 55 and furthermore, acrylic resin which was alkali-soluble, photosensitive and heat-flowable was coated to form a photosensitive resin layer 56.

Subsequently, as shown in FIG. 10E, the photosensitive resin layer 56 was subjected to a known photolithographic process to form a rectangular pattern, which was then heat-treated at a temperature of 200° C. to generate heating flow of resin, thereby forming a lens master 57 at an approximately suitable flow quantity of 0.1 µm on one side. Incidentally, the lens master 57 was a smooth semi-spherical lens 0.39 µm in height and 0.35 µm in gap between the lens masters.

Finally, by dry etching using a mixed gas consisting of $C_4F_8$ and $C_3F_8$ both fluorocarbon gas, the etching control layer 55 was etched with the lens master 57 being employed as a mask to form intermediate micro lenses. Then, by using this intermediate micro lenses consisting of the etching control layer as a mask, the transparent resin layer 54 was subjected to etching treatment. Further, the color filter 53 was etched away to a depth of 0.15 µm to form transfer lenses 58 as shown in FIG. 10F. The transfer lenses 58 were then heated for 18 minutes at a temperature of 230° C. to completely cure the transfer lenses 58, thereby manufacturing a solid state imaging device having a picture element size of 1.8 µm×1.8 µm. The transfer lenses 58 according to Example 10 were constructed such that a central portion thereof was constituted by the transparent resin layer 54 and a peripheral portion 59 thereof was constituted by an upper portion of the color filter 53.

Incidentally, the etching rate of the transparent resin layer employed in Example 10 was 1.1 times as large as the etching rate of the acrylic resin constituting the lens master. On the contrary, the etching rate of the phenol resin constituting the etching control layer was as small as 0.8 times the etching rate of the acrylic resin constituting the lens master.

Figure 11:
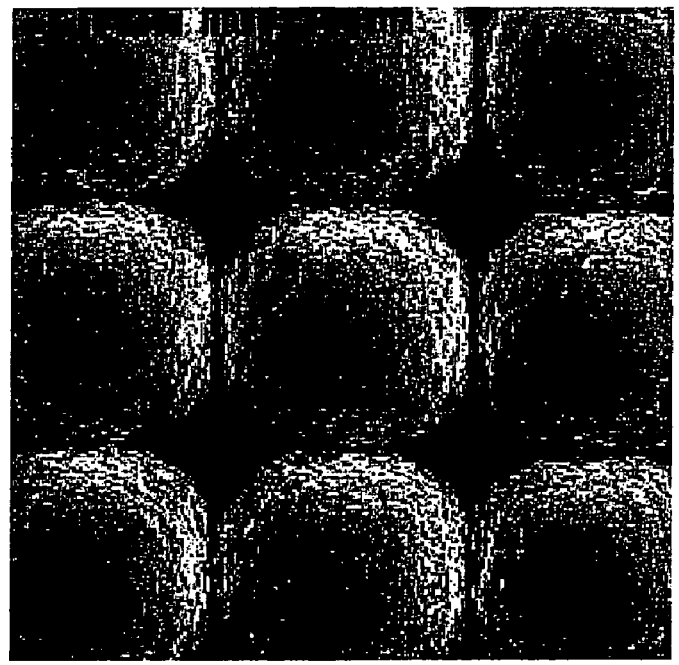
FIG. 11 is an SEM photograph of the surface of transfer lenses which were formed in Example 10.

The height of transfer lenses of the solid state imaging device thus obtained was 0.43 µm. FIG. 11 shows an SEM image of the transfer lenses which were formed in Example 10. It was confirmed from FIG. 11 that the transfer lenses had a surface roughness of 40 nm, indicating a smooth surface, and that the inter-lens gap thereof was confined to not more than 0.035 µm, thus indicating that the resin could be worked into lenses with a narrow gap which was confined to not more than the measurable limit of SEM.

Further, it was confirmed from FIG. 11 that the contact length between the neighboring transfer lenses (a length between gaps which was not more than 0.035 µm) was 0.8 µm (about 44% relative to a length of one side, i.e., 1.8 µm) and aperture ratio was about 85%. Since the contact length of transfer lens was relatively long, it was possible to enlarge the aperture ratio of micro lens and to obtain a solid state imaging device which was excellent in sensitivity.

According to the manufacturing method of the present invention, it is possible, even if the size of picture element is as very small as 1.8 µm, to manufacture a solid state imaging device provided with micro lens of smooth surface having a sufficiently narrow gap, while making it possible to control the height of transfer lens.

What is claimed is:

1. A solid state imaging device comprising:
    a plurality of photoelectric conversion devices arranged two-dimensionally;
    a color filter including a plurality of picture elements, each picture element being disposed to correspond to each of the photoelectric conversion devices; and
    a plurality of transfer lenses each disposed corresponding to each of the picture elements, formed of a fluorine-based acrylic resin, and formed directly on each of the picture elements,
    wherein a gap between sides of neighboring transfer lenses among said plurality of transfer lenses is not more than 0.035 μm, and a length of contact of the sides is within a range of 3-80% of a pitch of said plurality of transfer lenses, and the transfer lenses are formed by a method including
    forming the color filter;
    forming a transparent resin layer of the fluorine-based acrylic resin on the color filter;
    forming an etching control layer on the transparent resin layer, the etching control layer being enabled to be etched at a different etching rate from the etching rate of the transparent resin layer;
    forming a lens master on the etching control layer by using a heat-flowable resin material;
    transferring a pattern of the lens master to the etching control layer by dry etching to form an intermediate micro lens; and
    transferring a pattern of the intermediate micro lens to the transparent resin layer by dry etching to form the transfer lenses.

2. The solid state imaging device according to claim 1, wherein the transfer lenses have a surface roughness of 50 nm or less.

3. The solid state imaging device according to claim 1, wherein the transfer lenses contain not less than 0.2% of a compound having a refractive index of 1.47 or less.

4. The solid state imaging device according to claim 1, wherein each transfer lens has a peripheral portion which is constituted by an upper portion of the color filter.

5. A solid state imaging device, comprising:
    a plurality of photoelectric conversion devices arranged two-dimensionally;
    a color filter including a plurality of picture elements, each picture element being disposed to correspond to each of the photoelectric conversion devices; and
    a plurality of transfer lenses each disposed corresponding to each of the picture elements, formed of a fluorine-based acrylic resin, and formed directly on each of the picture elements,
    wherein a gap between sides of neighboring transfer lenses among said plurality of transfer lenses is not more than 0.035 μm, and a length of contact of the sides is within a range of 3-80% of a pitch of said plurality of transfer lenses, and
    wherein the transfer lenses have a surface roughness of 50 nm or less and contain not less than 0.2% of a compound having a refractive index of 1.47 or less.

6. The solid state imaging device according to claim 5, wherein each transfer lens has a peripheral portion which is constituted by an upper portion of the color filter.

7. A solid state imaging device, consisting essentially of:
    a plurality of photoelectric conversion devices arranged two-dimensionally;
    a color filter including a plurality of picture elements, each picture element being disposed to correspond to each of the photoelectric conversion devices; and
    a plurality of transfer lenses each disposed corresponding to each of the picture elements, formed of a fluorine-based acrylic resin, and formed directly on each of the picture elements,
    wherein a gap between sides of neighboring transfer lenses among said plurality of transfer lenses is not more than 0.035 μm, and a length of contact of the sides is within a range of 3-80% of a pitch of said plurality of transfer lenses, and
    wherein the transfer lenses have a surface roughness of 50 nm or less and contain not less than 0.2% of a compound having a refractive index of 1.47 or less.

8. The solid state imaging device according to claim 7, wherein each transfer lens has a peripheral portion which is constituted by an upper portion of the color filter.

* * * * *